US005740607A

United States Patent [19]

Zell et al.

[11] Patent Number: 5,740,607

[45] Date of Patent: Apr. 21, 1998

[54] METHOD FOR EQUIPPING A WIRING BACKPLANE

[75] Inventors: Karl Zell, Niederpoecking; Peter Seidel, Groebenzell, both of Germany

[73] Assignee: Siemens Aktiengesellschaft, Munich, Germany

[21] Appl. No.: 492,864

[22] Filed: Jun. 20, 1995

[30] Foreign Application Priority Data

Jun. 30, 1994 [DE] Germany .......................... 44 23 010.9

[51] Int. Cl.$^6$ .......................... H05K 3/00

[52] U.S. Cl. .......................... 29/845; 29/884; 439/943

[58] Field of Search .......................... 24/739, 884, 845; 439/943

[56] References Cited

U.S. PATENT DOCUMENTS 4,394,795 7/1983 Goss .......................... 29/739

5,160,272 11/1992 Zell et al. .......................... 439/607

5,320,549 6/1994 Schempp et al. .......................... 439/943

*Primary Examiner*—P. W. Echols

*Assistant Examiner*—Adrian L. Coley

*Attorney, Agent, or Firm*—Hill, Steadman & Simpson

[57] ABSTRACT

In order to reemploy the centering strips when equipping wiring backplanes with contact blades, the contact blades (2, 12) have their press-in zones introduced into a blade holder (1, 11) serving as a centering strip, being introduced thereinto in attitudinally correct allocation to one another. The contact blades (2, 12) introduced into the blade holder (1, 11) are pressed into the wiring backplane (5, 15) from the blade holder (1, 11) with a press-in die (7, 17) and the blade holder (1, 11) is pulled off from the contact blades (2, 12) when the press-in die (7, 17) is retracted.

10 Claims, 2 Drawing Sheets

METHOD FOR EQUIPPING A WIRING BACKPLANE

BACKGROUND OF THE INVENTION

The present invention is directed to a method for equipping a wiring backplane with contact blades.

Prior art wiring backplanes are individually equipped with contact blades or the contact blades are extrusion coated and then completely pressed into a wiring backplane. As a result, a centering strip of plastic remains on the wiring backplane and can no longer be employed or, respectively, removed.

SUMMARY OF THE INVENTION

It is an object of the present invention to provide a method for equipping a wiring backplane with contact blades wherein the assembly aid for the contact blades, that is, the centering strip, can be reemployed.

In a method of the type initially cited, this object is achieved in that the contact blades have their press-in zones inserted in a blade holder of plastic in attitudinally correct allocation to one another, in that the contact blades introduced into the blade holder are pressed into the wiring backplane from the blade holder with a press-in die, and in that the blade holder is pulled from the blades when the press-in die is retracted.

In the inventive method, an optimal number of contact blades having press-in zones are pressed into a wiring backplane with one stroke, whereby the blade holder, that is, the centering strip, of plastic can be multiply reemployed. That is, the equipped blade holder is taken from a transport container by the customer, the contact blades are pressed into the wiring backplane and the blade holders are pulled off and redeposited in the transport container when the press-in die is retracted. This container having the empty holders can be returned to the plug manufacturer and to the manufacturing process or, respectively, can be disposed of. A substantial saving is achieved by the introduction of this blade holder for multiple employment where no centering strip is required.

An expedient development of the method of the present invention is characterized in that the contact blades are aligned with respect to their position at that side of the blade holder facing toward the wiring backplane with a displaceable, correspondingly perforated template that is placed over the contact blade ends. An exact introduction of the contact blades into the wiring backplane is possible in this way.

The blade holder of the present invention has lateral undercuts that are provided as set-up surfaces for the pull-off tool.

An expedient blade holder for the implementation of the inventive method is characterized in that the width of the acceptance slots for the contact blades is slightly greater than the width of the contact blades in order to create a tolerance compensation. As a result thereof, a tolerance compensation with respect to the holes on the wiring backplane is possible, that is, the pressed-in contact blades reside absolutely perpendicular and with optimal utilization in the press-in zone.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
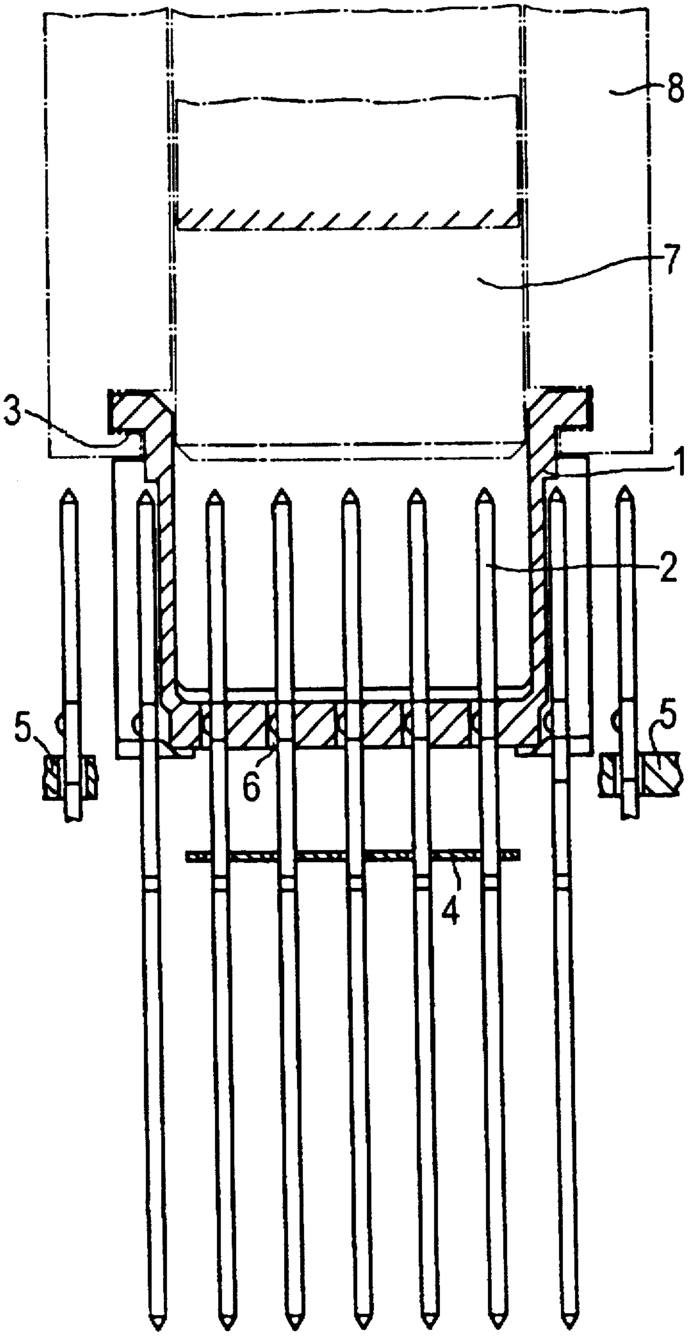
FIG. 1 is a cross section view through a blade holder provided with contact blades for the implementation of the inventive method, whereby the pull-off means is arranged over the contact blades.

During manufacturer of a plug, individual contact blades 2, 12 are introduced into the blade holder 1, 11, where they are held in acceptance slots 6, 16 by their press-in zones. By an appropriate selection of materials, the retaining force of the contact blades 2, 12 can be made large or, respectively, the pull-off force of the blade holder 1, 11 from the contact blades can be kept low.

On site at the customer, the blade holder 1, 11 is put in place onto the wiring backplane 5, 15. A template 4, 14 serving as centering foil assists in the introduction of the contact blades 2, 12 into the openings of the wiring backplane 5, 15. Subsequently, the contact blades 2, 12 are pressed into the wiring backplane 5, 15 with their press-in zones and using a press-in die 7, 17. After the press-in event, the press-in die 7, 17 is retracted and the blade holder 1, 11 is simultaneously pulled off from the contact blades 2, 12 with a pull-off means 8, 18. To that end, the blade holder 1, 11 has undercuts 3, 13 that engage the pull-off device.

Figure 2:
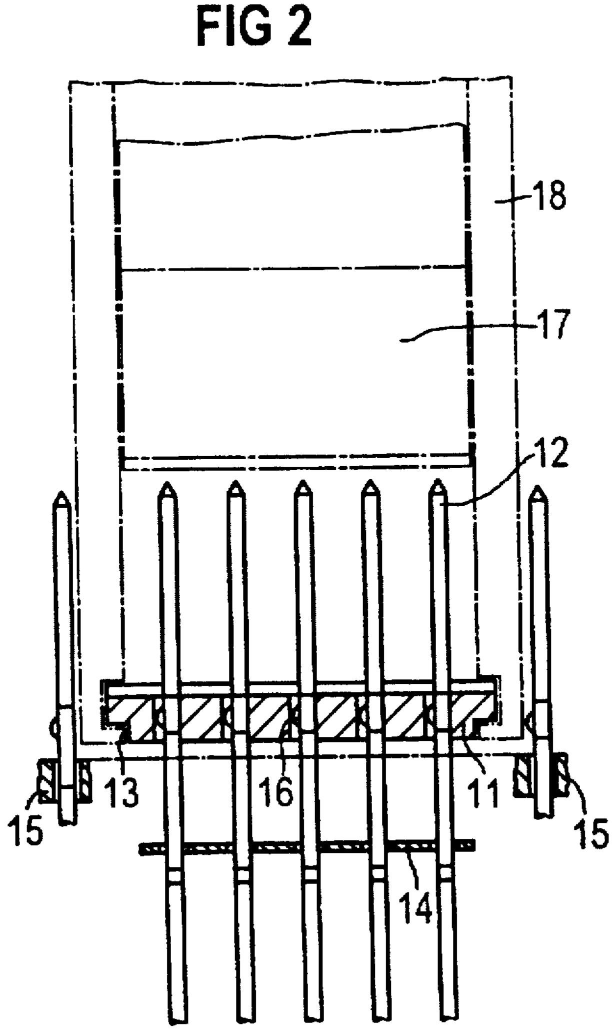
FIG. 2 is a cross section view through a blade holder provided with contact blades, whereby the pull-off means is arranged next to the contact pins.

A through pin field can be produced with the blade holder shown in FIG. 1, whereas one row of pins is missing every 15 mm (corresponding to a unit width) with the blade holder shown in FIG. 2. The full equipping with the blade holder 1 shown in FIG. 1 is possible because the pull-off device 8 is arranged over the contact pins.

When a centering strip is required for a wiring backplane, a blade holder 1 as shown in FIG. 1 can be employed, and is not pulled off after the press-in event of the contact blades 2.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A method for equipping a wiring backplane with contact blades, comprising the steps of:

providing the contact blades with press-in zones;

providing a blade holder having a press-in die;

introducing the press-in zones of the contact blades into the blade holder in a predetermined arrangement of contact blades;

pressing the contact blades into the wiring backplane from the blade holder with the press-in die; and retracting the press-in die, the blade holder thereby being pulled off of the contact blades.

2. The method according to claim 1, wherein the contact blades are aligned with respect to their position on a side of the blade holder facing toward the wiring backplane, being aligned with a displaceable, correspondingly perforated template that is pushed over ends of the contact blades.

3. The method according to claim 1, wherein the blade holder is a plastic blade holder.

4. A blade holder system for use in equipping a wiring backplane with contact blades, comprising:

a blade holder having a press-in die;

a pull-off tool having lateral undercuts for engaging the blade holder;

the contact blades having press-in zones for engaging acceptance slots in the blade holder; and wherein the contact blades have their press-in zones introduced into the blade holder in a predetermined aligned arrangement of contact blades, wherein the contact blades introduced into the blade holder are pressed into the wiring backplane from the blade holder with the press-in die, and wherein upon retraction of the press-in die, the blade holder is pulled off from the contact blades by the pull-off tool.

5. The blade holder system according to claim 4, wherein the blade holder system further comprises a displaceable perforated template, and wherein the contact blades are aligned with respect to their position on a side of the blade holder facing toward the wiring backplane, being aligned with the displaceable perforated template that is pushed over ends of the contact blades.

6. The blade holder system according to claim 4, wherein a width of the acceptance slots for the contact blades is slightly larger than a width of the contact blades for creating a tolerance compensation.

7. The blade holder system according to claim 4, wherein the blade holder is a plastic blade holder.

8. A blade holder system for use in equipping a wiring backplane with contact blades, comprising:

a blade holder having a press-in die;

a pull-off tool having lateral undercuts for engaging the blade holder;

the contact blades having press-in zones for engaging acceptance slots in the blade holder;

a displaceable perforated template that engages the contact blades; and wherein the contact blades have their press-in zones introduced into the blade holder in a predetermined aligned arrangement of contact blades, wherein the contact blades are aligned with the displaceable perforated template that is pushed over ends of the contact blades, wherein the contact blades introduced into the blade holder are pressed into the wiring backplane from the blade holder with the press-in die, and wherein upon retraction of the press-in die, the blade holder is pulled off from the contact blades by the pull-off tool.

9. The blade holder system according to claim 8, wherein a width of the acceptance slots for the contact blades is slightly larger than a width of the contact blades for creating a tolerance compensation.

10. The blade holder system according to claim 8, wherein the blade holder is a plastic blade holder.

* * * * *